(12) United States Patent
Nakahata et al.

(10) Patent No.: US 6,635,938 B1
(45) Date of Patent: Oct. 21, 2003

(54) SEMICONDUCTOR DEVICE AND MANUFACTURING METHOD THEREOF

(75) Inventors: Takumi Nakahata, Tokyo (JP); Shigemitsu Maruno, Tokyo (JP); Taisuke Furukawa, Tokyo (JP); Naruhisa Miura, Tokyo (JP); Toshiyuki Oishi, Tokyo (JP); Yasunori Tokuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 114 days.

(21) Appl. No.: 09/716,219

(22) Filed: Nov. 21, 2000

(30) Foreign Application Priority Data

Mar. 7, 2000 (JP) ........................ 2000-062482

(51) Int. Cl.$^7$ ........................ H01L 29/94; H01L 31/062; H01L 31/113; H01L 31/119
(52) U.S. Cl. ........................ 257/382
(58) Field of Search ................ 257/382–385, 257/344; 438/197, 201, 299

(56) References Cited

U.S. PATENT DOCUMENTS

| | | | | |
|---|---|---|---|---|
| 4,592,792 A | | 6/1986 | Corboy, Jr. et al. ......... 148/175 |
| 4,714,685 A | * | 12/1987 | Schubert .................... 438/297 |
| 5,994,227 A | * | 11/1999 | Matsuo et al. ............... 216/74 |
| 6,027,977 A | * | 2/2000 | Mogami ..................... 438/287 |
| 6,235,112 B1 | * | 5/2001 | Satoh ....................... 117/102 |
| 6,297,162 B1 | * | 10/2001 | Jang et al. ................. 438/706 |

FOREIGN PATENT DOCUMENTS

JP 5-55479 8/1993

OTHER PUBLICATIONS

Ueda, Kenji. Matsushita Electron. Corp. Manufacture of Semiconductor Memory Device. JPAB Publication No. JP404056285A. Jun. 25, 1990. (abstract).*
Nakahata et al., "Si Deposition Into Fine Contact Holes By Ultrahigh–Vacuum Chemical Vapor Deposition", Japanese Journal of Applied Physics, vol. 38, Part 1, No. 7A, Jul. 1999, pp. 4045–4046.
Suemitsu et al., "Si And Ge Gas–Source Molecular Beam Epitaxy (GSMBE)", Journal of Crystal Growth, vol. 107, 1991, pp. 1015–1020.
Sayama et al., "Low Resistance Co–Salicided 0.1µm CMOS Technology Using Selective Si Growth", 1999 Symposium on VISI Technology, Jun. 1999, pp. 55–56.

* cited by examiner

*Primary Examiner*—Craig Thompson
(74) *Attorney, Agent, or Firm*—Leydig, Voit & Mayer, Ltd.

(57) ABSTRACT

A polysilicon nitride film is formed to cover a polysilicon gate. By heat treatment of the silicon nitride film in an oxygen atmosphere, a silicon oxinitride film is formed. By anisotropically etching the silicon oxinitride film and the silicon nitride film, a sidewall insulating film is formed. By epitaxial growth, selective silicon films of a prescribed film thickness are formed on source and drain regions. During this period, silicon islands are not deposited on the surface of sidewall insulating film. Consequently, a semiconductor device including a transistor of a superior electrical insulation can be obtained.

22 Claims, 17 Drawing Sheets

SEMICONDUCTOR DEVICE AND MANUFACTURING METHOD THEREOF

BACKGROUND OF THE INVENTION

1. Field of the Invention

The present invention relates to a semiconductor device and manufacturing method thereof and, more specifically, to a semiconductor device in which electrical insulation of a transistor is ensured, as well as to the manufacturing method thereof.

2. Description of the Background Art

A method of manufacturing a semiconductor device including an MOS transistor, as an example of a conventional semiconductor device, will be described with reference to the figures, First, referring to FIG. 23, a trench element isolating film 102 for forming an element forming region is formed on a silicon substrate 101. Thereafter, a thermal oxide film (not shown) is formed on a surface of silicon substrate 101 by thermal oxidation.

On the thermal oxidation film, a polycrystalline silicon film and a silicon oxide film (both not shown) are formed by the CVD method. On the silicon oxide film, a prescribed photoresist pattern (not shown) is formed. Using the photoresist pattern as a mask, the silicon oxide film, the polycrystalline silicon film and the thermal oxide film are anisotropically etched, so that a gate oxide film 106, a polysilicon gate 107 and a silicon oxide film 108 are formed.

Thereafter, as shown in FIG. 24, a silicon oxide film 109 is formed by the CVD method on silicon substrate 101 to cover polysilicon gate 107 and the like. Thereafter, as shown in FIG. 25, silicon oxide film 109 is anisotropically etched, so as to form sidewall oxide films 109a on the side surfaces of polysilicon gate 107.

Thereafter, as shown in FIG. 26, an impurity producing a prescribed conductivity type is introduced by ion implantation into the surface of silicon substrate 101. Further, by heat treatment, a pair of source and drain regions 111a and 111b are formed.

Thereafter, referring to FIG. 27, silicon films 112a and 112b are formed selectively only on the surfaces of source and drain regions 111a and 111b by selective epitaxial growth. Thereafter, as shown in FIG. 28, an impurity of the same conductivity type as source and drain regions 111a and 111b are introduced by ion implantation into selective silicon films 112a and 112b, and by heat treatment, the selective silicon films 112a and 112b are adapted to have lower resistance, whereby low resistance selective silicon films 113a and 113b are formed, respectively.

In this manner, an MOS transistor T including a polysilicon gate 107, a pair of source and drain regions 111a and 111b and low resistance selective silicon films 113a and 113b are formed.

Thereafter, referring to FIG. 29, an interlayer silicon oxide film 114 is formed by the CVD method on silicon substrate 101 to cover the MOS transistor T. On the interlayer silicon oxide film 114, a prescribed photoresist pattern (not shown) is formed. Using the photoresist pattern as a mask, the interlayer silicon oxide film 114 is anisotropically etched, whereby contact holes 121a and 121b exposing surfaces of low resistance selective silicon films 113a and 113b are formed, respectively.

Thereafter, a prescribed metal film is formed by sputtering, for example, and a prescribed heat treatment is performed. Thus, a titanium silicide film 115, a titanium nitride film 116 and a tungsten film 117 are formed in contact holes 121a and 121b. Thereafter, on the interlayer silicon oxide film 114, a prescribed metal interconnection (not shown) electrically connected to tungsten film 117 is formed. An interlayer insulating film and a passivation film (both not shown), for example, are further formed on interlayer silicon oxide film 114, to cover the metal interconnection. By prescribed photolithography and etching, interconnection pads and the like are formed.

The conventional semiconductor device is thus completed through the above described steps.

As described above, in the conventional semiconductor device, the sidewall oxide film 109a of silicon oxide film has been applied as a sidewall insulating film. Here, in the step of FIG. 27, when selective silicon films 112a and 112b are formed, selectivity of silicon epitaxial growth is established on the source and drain regions 111a and 111b (silicon substrate) and on the sidewall oxide film 109a (silicon oxide film) adjacent thereto, and therefore it is possible to form selective silicon films 112a and 112b selectively only on the source and drain regions 111a and 111b.

There has been a demand to increase degree of integration of the semiconductor devices for miniaturization. In order to meet such a demand, use of a silicon nitride film in place of the conventional silicon oxide film as the sidewall insulating film is expected. This is to ensure registration margin for photolithography when contact holes 121a and 121b are to be formed in interlayer silicon oxide film 114.

Use of the silicon nitride film as the sidewall insulating film may lead to the following problem. The silicon nitride film has lower selectivity with respect to the silicon substrate at the time of silicon epitaxial growth, as compared with the silicon oxide film. Therefore, in the process of epitaxial growth of the selective silicon film having the prescribed film thickness, silicon island 118 would be formed on the surface of sidewall insulating film 130 of silicon nitride film, as shown in FIG. 30.

If such silicon islands 118 are formed, the selective silicon film 112b would be electrically connected to other selective silicon film through the silicon island 118, possibly causing electric short-circuit of source and drain region 111b with other source and drain regions. As a result, the semiconductor device cannot perform a desired operation.

SUMMARY OF THE INVENTION

The present invention was made to solve the above described problem. One object of the present invention is to provide a semiconductor device capable of ensuring electrical insulation and another object is to provide a method of manufacturing such a semiconductor device.

According to an aspect, the present invention provides a semiconductor device including a semiconductor substrate having a main surface, first and second conductive layers, a silicon nitride film and a protective layer. The first and second conductive layers are formed spaced from each other on the main surface of the semiconductor substrate. The silicon nitride film is formed on the main surface of the semiconductor substrate traversing between the first and second conductive layers. The protective layer is formed on the surface of the silicon nitride film and at least until the first and second conductive layers are formed to a prescribed film thickness, prevents deposition of the material of the first and second conductive layers on the surface of the silicon nitride film.

In this structure, deposition of the material of the first and second conductive layers on the silicon nitride film can be prevented by the protective film until the first and second conductive layers are formed to a prescribed film thickness. As a result, electrical short-circuit between the first and second conductive layers through the material can be prevented.

Especially when the semiconductor substrate includes a silicon substrate and the first and second conductive layers include silicon epitaxial growth layer, the protective layer should preferably be a layer preventing the material of the epitaxial growth layer. Here, it is possible to prevent deposition of silicon pieces on the surfaces of the silicon nitride film. Preferably, the semiconductor device includes a pair of impurity regions of a prescribed conductivity type formed spaced from each other on the main surface of the semiconductor substrate, an electrode portion formed on the main surface of the semiconductor substrate sandwiched between the pair of impurity regions, and sidewall insulating films formed on the side surfaces of the electrode portion, in which the first and second conductive layers are formed on the surfaces of one end and the other of the pair of impurity regions, and the sidewall insulating film includes a silicon nitride film and a protective layer.

Here, in the transistor including a pair of impurity regions and the electrode portion, it is possible to prevent electrical short circuit between one impurity region with the other impurity region or with an impurity region of another transistor, whereby operation of the transistor can be made stable. Further, as the sidewall insulating film has a silicon nitride film, it is possible to ensure registration margin for photolithography when a prescribed contact hole is to be formed near the electrode portion, as will be described later.

In order to prevent deposition of the material to be the first and second conductive layers, it is preferred that the protective layer includes at least an element selected from the group consisting of oxygen, hydrogen and halogen.

Preferably, the prescribed thickness of the first and second conductive layers is at least 50 nm. With this thickness, it is possible to form the first and second conductive layers with high precision.

According to a second aspect, the present invention provides the method of manufacturing a semiconductor device including the following steps. A silicon nitride film is formed on a prescribed region on a main surface of a semiconductor substrate. First and second conductive layers are formed by epitaxial growth on one and the other portions on the main surface of a semiconductor substrate sandwiching a prescribed region. Between the step of forming the silicon nitride film and the step of forming the first and second conductive layers, a prescribed process is performed on the silicon nitride film, so that a protective layer is formed on a surface of the silicon nitride film, the protective layer preventing deposition of the material of the first and second conductive layers on the surface of the silicon nitride film, until the first and second conductive layers reach a prescribed film thickness.

By this manufacturing method, while the first and second conductive films of the prescribed film thickness are formed by epitaxial growth, a protective layer is formed on the silicon nitride film, so that it becomes possible to prevent deposition of the material of the first and second conductive layers on the surface of the silicon nitride film. As a result, electrical short-circuit between the first and second conductive layers through such a material can be prevented.

Preferably, the manufacturing method includes the steps of forming a pair of impurity regions of a prescribed conductivity type electrically connected to the first and second conductive layers, respectively, forming an electrode portion on a prescribed region of the semiconductor substrate, and forming a sidewall insulating film including a silicon nitride film and a protective layer on a side surface of the electrode portion.

Here, a transistor including the electrode portion and the pair of impurity regions is formed, and in the transistor, it is possible to prevent electrical short-circuit of one impurity region with the other impurity region or with an impurity region of another transistor. As a result, a semiconductor device with the transistor operation made stable can be obtained.

The step of forming the sidewall insulating film specifically includes the following two steps. One is the step of forming a protective layer by a prescribed processing on the silicon nitride film form to cover the electrode portion, and anisotropically etching the silicon nitride film and the protective layer. Another is the step of anisotropically etching the silicon nitride film formed on the semiconductor substrate to cover the electrode portion, so as to leave the silicon nitride film on the side surface of the electrode portion, followed by the prescribed processing.

The prescribed processing mentioned above specifically includes the following process. First, heat treatment is performed in an oxygen gas atmosphere. Water vapor may be added to the oxygen gas atmosphere. Hydrogen may be added to the oxygen gas atmosphere. Ozone may be added to the oxygen gas atmosphere. Aside from the heat treatment in the oxygen atmosphere, the heat treatment may be performed in a hydrogen gas atmosphere. The heat treatment may be performed in a halogen gas atmosphere. The heat treatment may be performed in ozone atmosphere. Further, heat treatment may be performed in an activated oxygen atmosphere. Further, heat treatment may be performed in an activated hydrogen gas atmosphere. At least one selected from the group consisting of oxygen, hydrogen and halogen may be introduced by ion implantation. By such a process, it is possible to form a desired protective layer on the surface and in the vicinity of the silicon nitride film.

Preferably, the prescribed thickness of the first and second conductive layers is at least 50 nm. With this thickness, it is possible to form the first and second conductive layers with high precision.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
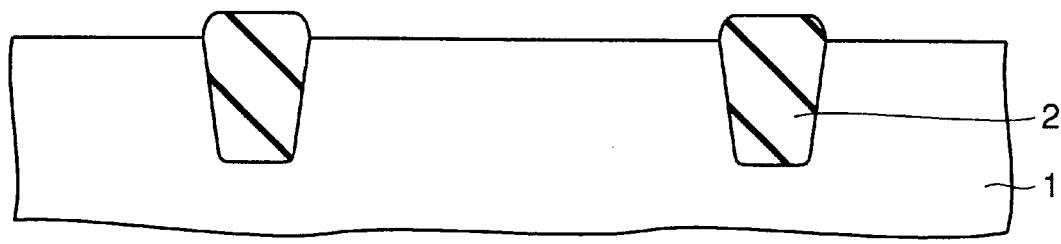
FIG. 1 is a cross section representing a step of the method of manufacturing a semiconductor device in accordance with a first embodiment of the present invention.

The semiconductor device in accordance with the first embodiment of the present invention and manufacturing method thereof will be described. First, the manufacturing method will be described with reference to the figures. First, referring to FIG. 1, a trench element isolating film 2 for forming an element forming region, is formed at the silicon substrate 1. Then, referring to FIG. 2, a thermal oxide film 6 is formed by thermal oxidation on silicon substrate 1. On the thermal oxide film 6, a polysilicon film 7 is formed by the CVD method. On the polysilicon film 7, a silicon oxide film 8 is formed by the CVD method.

Figure 3:
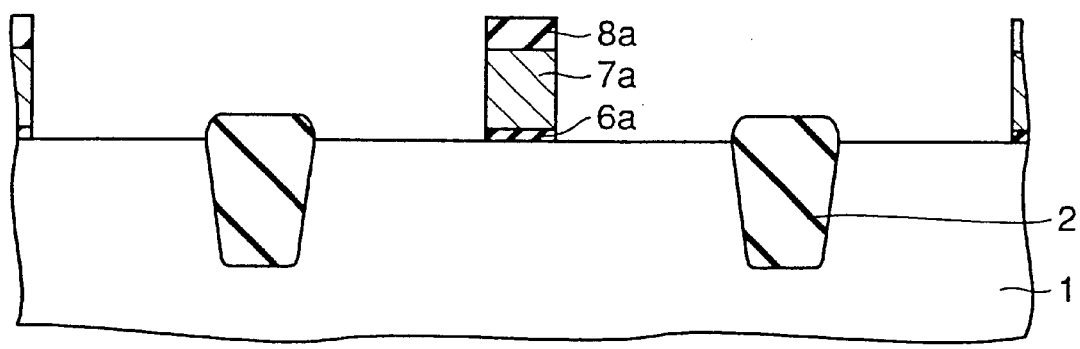
FIG. 3 is a cross sectional view showing the step following the step of FIG. 2 in the same embodiment.
Figure 4:
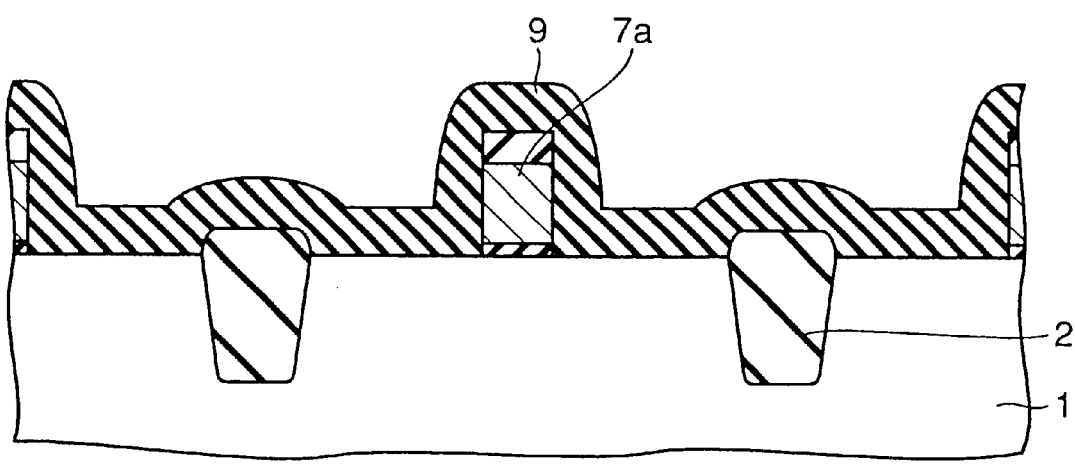
FIG. 4 is a cross sectional view showing the step following the step of FIG. 3 in the same embodiment.

Thereafter, as shown in FIG. 3, a prescribed photoresist pattern (not shown) is formed on silicon oxide film 8. Using the photoresist pattern as a mask, silicon oxide film 8, polysilicon film 7 and thermal oxide film 6 are anisotropically etched in this order, so as to form a gate oxide film 6a, a polysilicon gate 7a and a silicon oxide film 8a. Thereafter, as shown in FIG. 4, a silicon nitride film 9 is formed on silicon substrate 1 by the CVD method, to cover polysilicon gate 7a.

Figure 5:
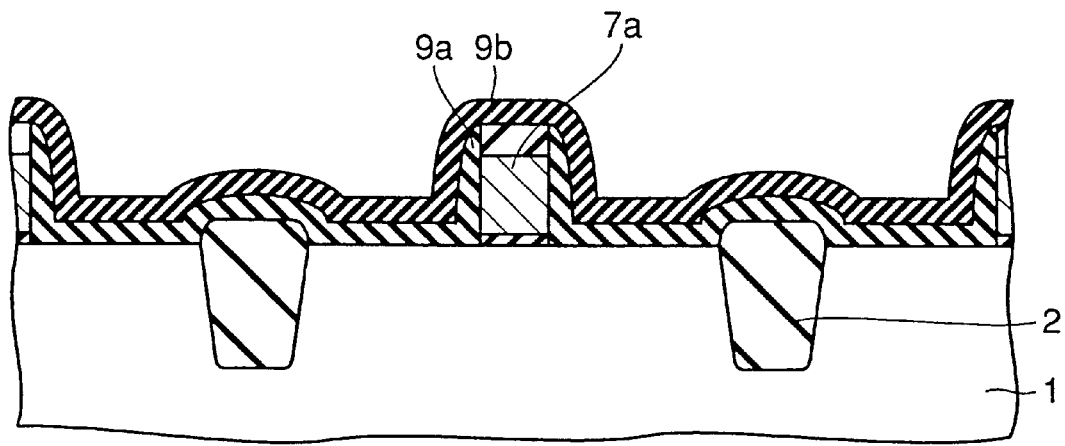
FIG. 5 is a cross sectional view showing the step following the step of FIG. 4 in the same embodiment.

Thereafter, as shown in FIG. 5, silicon nitride film 9 is heat-treated in an oxygen atmosphere. At this time, as the surface of silicon nitride film 9 is exposed to oxygen, the surface of silicon nitride film 9 is oxidized, and a silicon oxinitride film 9b containing a large amount of oxygen is formed. Lower portions of silicon nitride film 9 is not oxidized but left as silicon nitride film 9a.

Figure 6:
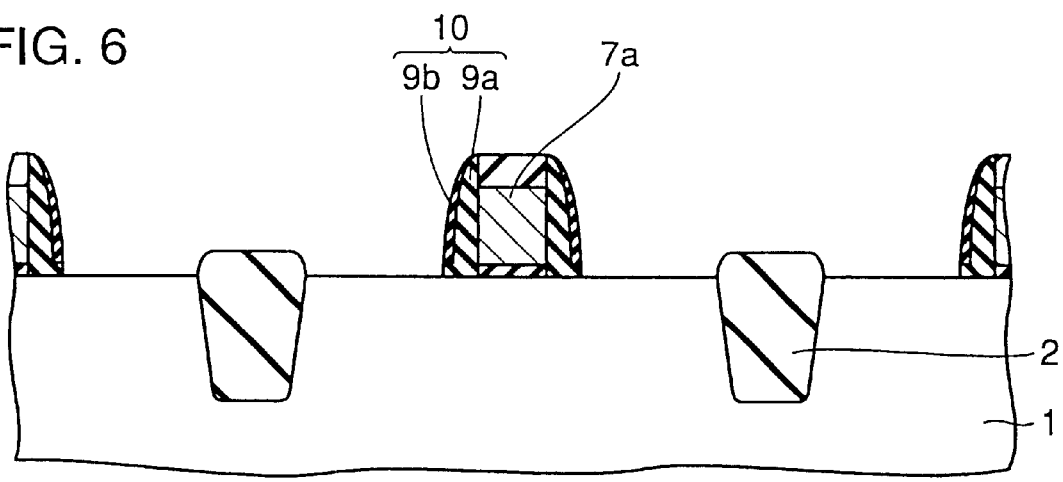
FIG. 6 is a cross sectional view showing the step following the step of FIG. 5 in the same embodiment.
Figure 7:
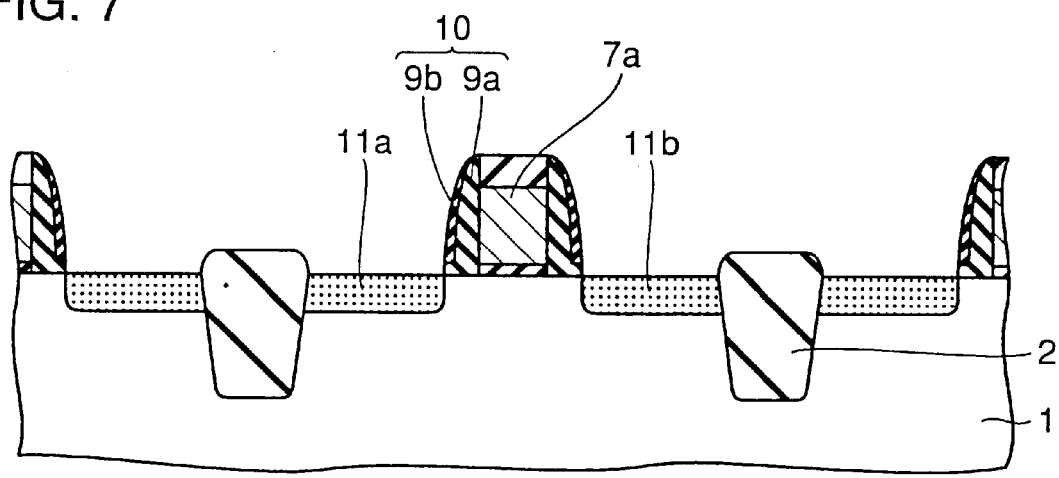
FIG. 7 is a cross sectional view showing the step following the step of FIG. 6 in the same embodiment.

Thereafter, as shown in FIG. 6, silicon oxinitride film 9b and silicon nitride film 9a are anisotropically etched, whereby a sidewall insulating film 10 containing silicon oxinitride film 9b and silicon nitride film 9a is formed on a side surface of polysilicon gate 7a. Thereafter, as shown in FIG. 7, an impurity of a prescribed conductivity type is introduced by ion implantation to the surface of silicon substrate 1 and heat treatment is performed, whereby source and drain regions 11a and 11b are formed.

Figure 8:
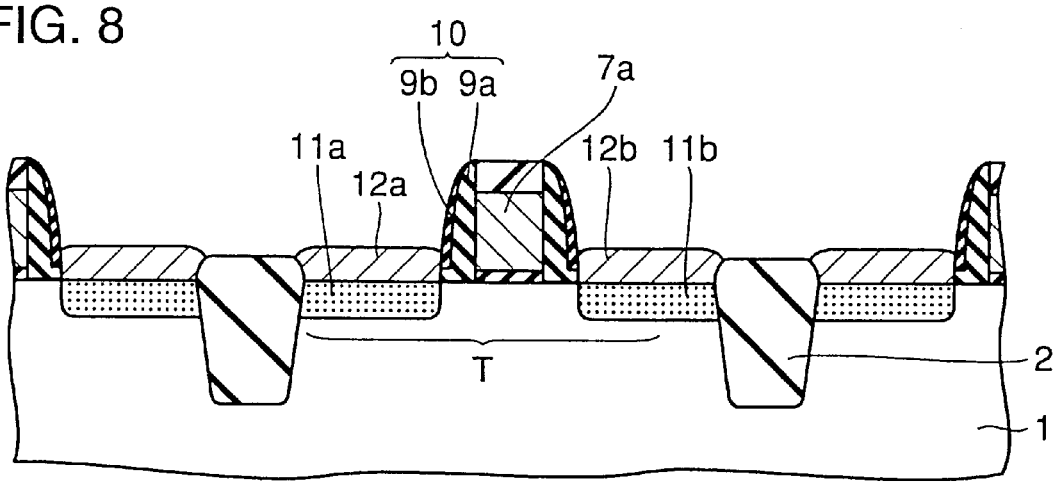
FIG. 8 is a cross sectional view showing the step following the step of FIG. 7 in the same embodiment.

Thereafter, as shown in FIG. 8, with the disilane flow rate of 3 to 10 sccm, chlorine flow rate of 0.1 to 0.3 sccm at a temperature of 630 to 700° C., selective silicon films 12a and 12b are formed selectively only on source and drain regions 11a and 11b by silicon epitaxial growth.

At this time, while the selective silicon films 12a and 12b of a desired film thickness of at least 50 nm are formed, for example, selectivity of epitaxial growth is ensured as the silicon oxinitride film 9b is formed on the surface of sidewall insulating film 10, and therefore formation of silicon pieces on the surface of sidewall insulating film 10 can be prevented, as will be described in detail later.

Thus, an MOS transistor T including polysilicon gate 7a and a pair of source and drain regions 11a and 11b is completed. Thereafter, an impurity of the same conductivity type as source and drain regions 11a and 11b is introduced by ion implantation to selective silicon films 12a and 12b, and heat treatment is performed, whereby selective silicon films 12a and 12b comes to have low resistance. Thus, low resistance selective silicon films 13a and 13b are formed, respectively.

Figure 9:
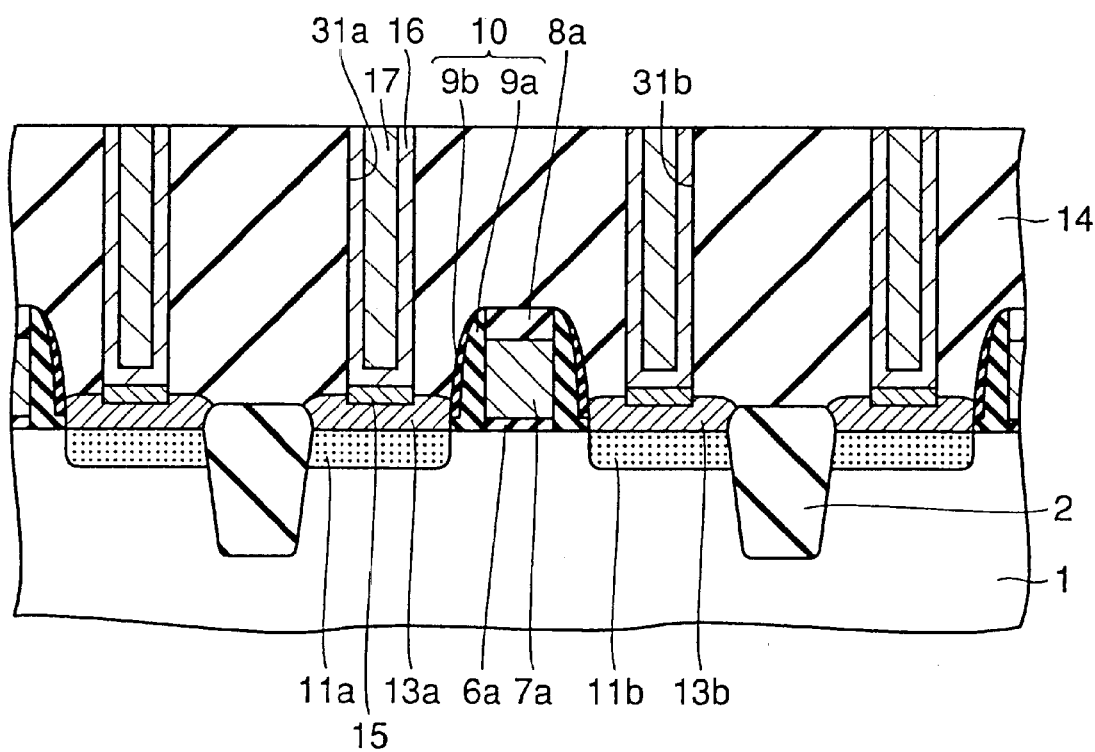
FIG. 9 is a cross sectional view showing the step following the step of FIG. 8 in the same embodiment.

Thereafter, as shown in FIG. 9, an interlayer silicon oxide film 14 is formed, for example, by the CVD method on silicon substrate 1 to cover the MOS transistor T. On the interlayer silicon oxide film 14, a prescribed photoresist pattern (not shown) is formed.

Using the photoresist pattern as a mask, interlayer silicon oxide film 14 is anisotropically etched, whereby contact holes 31a and 31b exposing surfaces of low resistivity selective silicon films 13a and 13b are formed, respectively. A metal film is is formed by sputtering, in contact holes 31a and 31b, and heat treatment or the like is performed, to form a titanium silicide film 15, a titanium nitride film 16, and a tungsten film 17.

Thereafter, a metal interconnection (not shown) electrically connected to tungsten film 17 is formed on interlayer silicon oxide film 14. On interlayer silicon oxide film 14, an interlayer insulating film and a passivation film (both not shown) are further formed to cover the metal interconnection. Through these steps, the semiconductor device including the MOS transistor is completed.

According to the manufacturing method described above, formation of regions of silicon on the surface of sidewall insulating film 10 when the selective silicon films 12a and 12b are grown can be prevented, because of the silicon oxynitride film 9b on the surface of sidewall insulating film 10. Therefore, electrical short-circuiting of one source and drain region with the other source and drain region or with the source and drain region of another transistor can be prevented. As a result, transistor operation can be made stable.

Now, the mechanism preventing formation of silicon regions on sidewall insulating film 10 when selective silicon films 12a and 12b are grown by selective epitaxial growth is described. A silicon hydride gas such as disilane or silane will be described as an example of the source gas used for selective epitaxial growth of silicon.

FIGS. 10 to 13 show change with time of the manner how the selective silicon film 12b is formed on the source and drain region 11b, in accordance with a technical article (T. Nakahata, et al.: Jpn. J. Appl. Phys. Vol. 38 (1999) pp. 4045–4046).

Figure 10:
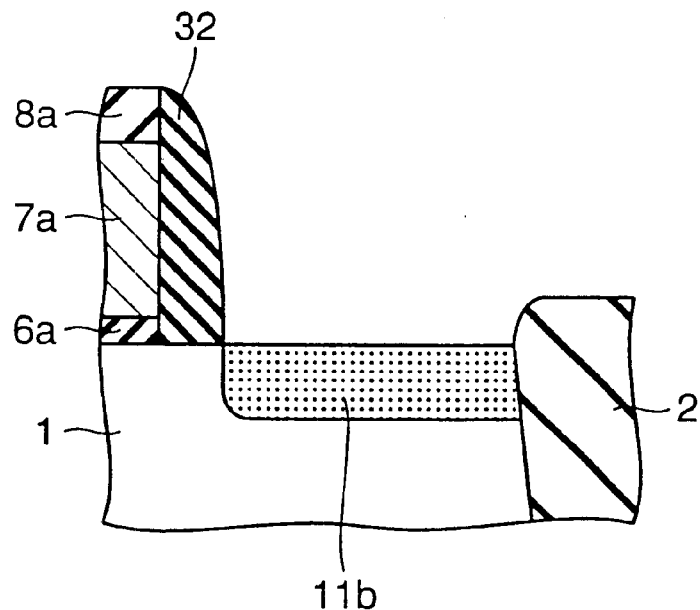
FIG. 10 is a cross section showing a process illustrating silicon epitaxial growth in the same embodiment.
Figure 11:
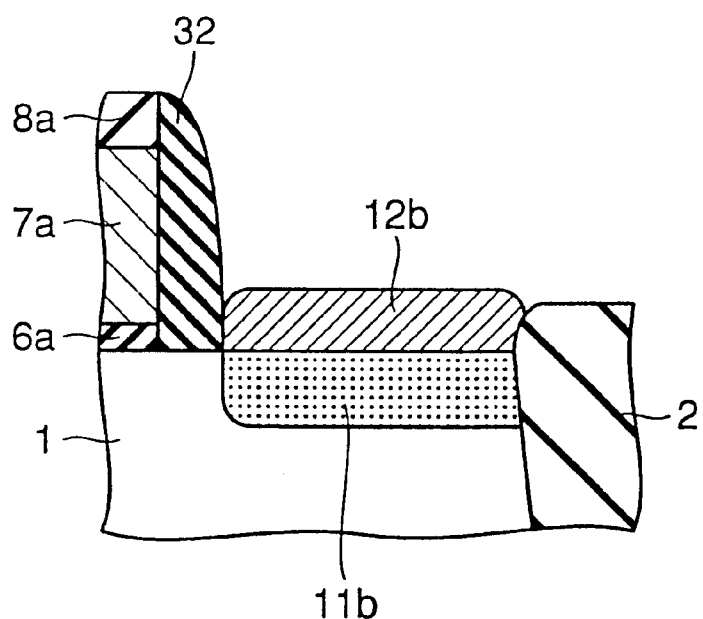
FIG. 11 is a cross sectional view showing the step following the step of FIG. 10 in the same embodiment.

FIG. 10 shows a state immediately before the formation of the selective silicon film. FIG. 11 shows the initial state when silicon epitaxial growth starts, in which the selective silicon film is formed only on the source and drain region 11b and not on the surfaces of sidewall insulating film 32 and trench element isolating film.

Figure 12:
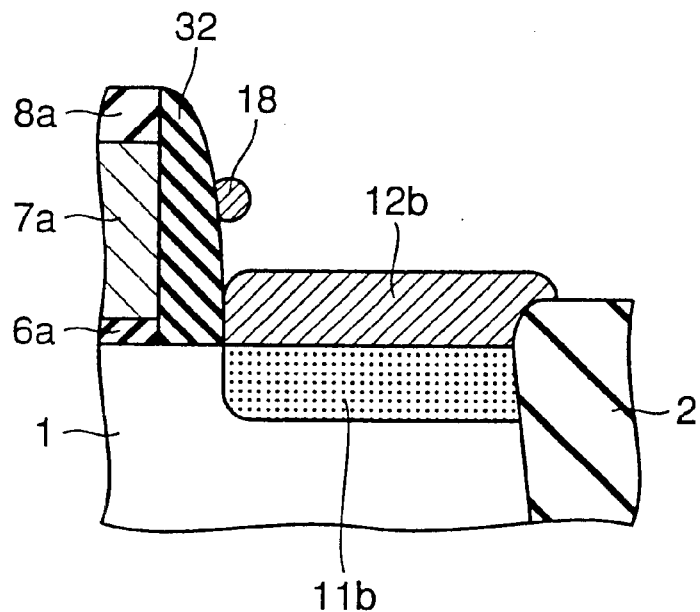
FIG. 12 is a cross sectional view showing the step following the step of FIG. 11 in the same embodiment.

After a prescribed time period, however, a polysilicon piece 18 forms on the surface of sidewall insulating film 32 or the like as shown in FIG. 12, and selectively of epitaxial growth is lost gradually. The time period in which selectivity of the epitaxial growth is ensured is referred to as a critical time period.

Figure 13:
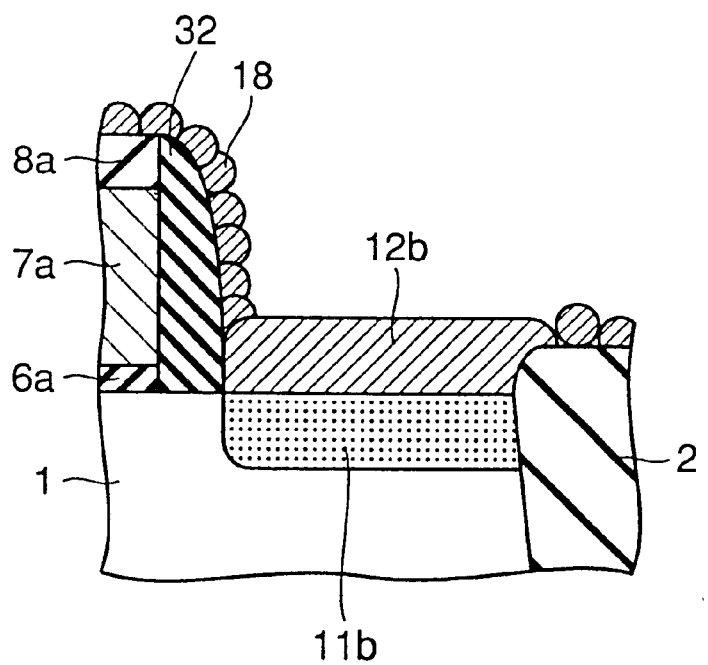
FIG. 13 is a cross sectional view showing the step following the step of FIG. 12 in the same embodiment.

As time passes, the surface of sidewall insulating film 32 and the like come to be completely covered by polysilicon pieces 18 as shown in FIG. 13. In order to prevent formation of such polysilicon pieces 18, it is necessary to form the selective silicon film of a prescribed film thickness within the critical time period. The film thickness of the selective silicon film 21b formed within the critical time period is defined by the product of the critical time period and the rate of growth, and the thickness is specifically referred to as critical film thickness.

Figure 14:
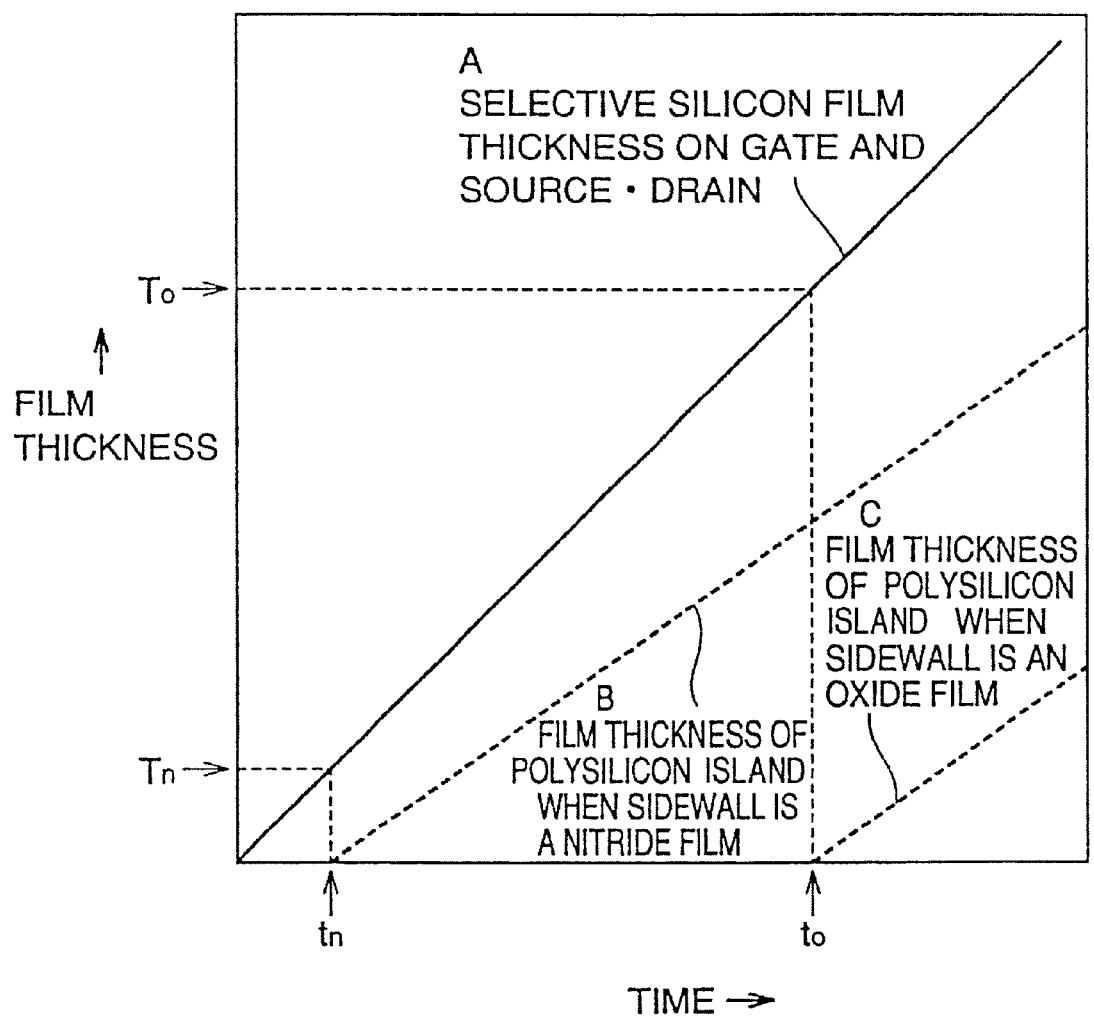
FIG. 14 is a graph representing time dependency of the film thickness of the epitaxial growth layer for various different under-layers in the same embodiment.

The critical time period mentioned above in which the selectivity is ensured depends on the material of the sidewall insulating film. This is as shown in FIG. 14. FIG. 14 is a graph showing time dependency of the film (silicon substrate), film thickness (C) of the polysilicon film formed on the sidewall insulating film of silicon oxide film, and film thickness (B) of the polysilicon piece formed on the sidewall insulating film of silicon nitride film.

As can be seen from the line C on the graph, when the sidewall insulating film is a silicon oxide film, no polysilicon region is deposited on the sidewall insulating film before the critical time point $t_o$. At time $t_o$, the critical film thickness of the selective silicon film is $T_o$.

When the side wall insulating film is a silicon nitride film, the critical time period is time point $t_n$ as can be seen from the line B in the left, and the critical film thickness of the selective silicon film is $T_n$.

It has been found that the critical film thickness $T_n$ is about one tenth of the value of critical film thickness $T_o$. When the design rule attains to be 0.1 µm or smaller, the required film thickness of the selective silicon film is expected to be about 50 nm.

The critical film thickness under the typical epitaxial growth condition when the sidewall insulating film is formed of silicon oxide film is about 100 nm. When the sidewall insulating film of silicon nitride film is used in this situation, it is expected that the critical film thickness is about 10 nm. This means that it is impossible to form the selective silicon film of the prescribed film thickness within the critical time period if the design rule is 0.1 µm or smaller.

In the semiconductor device in accordance with the present embodiment, the surface of silicon nitride film 9 which will be the sidewall insulating film is subjected to heat treatment in an oxygen atmosphere in the step shown in FIG. 5, and therefore the surface and the vicinity of silicon nitride film 9 are oxidized, providing a silicon oxinitride film 9b.

Therefore, it becomes possible to extend the critical time period in forming the selective silicon films 12a and 12b to approximately the critical time period $T_o$ for the sidewall insulating film formed of silicon oxide film. Therefore, it becomes possible to form selective silicon films 12a and 12b of the desired film thickness without depositing the silicon pieces on the surface of sidewall insulating film 10.

Further, as the sidewall insulating film 10 includes silicon nitride film 9a, it becomes possible to ensure margin for photolithography, when the prescribed contact hole exposing surfaces of selective silicon films 12a and 12b is formed. As a result, good electrical connection can be established between the source and drain regions 11a and 11b of the MOS transistor and the metal interconnection.

In the step shown in FIG. 5, heat treatment is performed on the silicon nitride film 9 in an oxygen atmosphere. Water vapor, hydrogen or ozone may be added to the oxygen atmosphere. By the addition of water vapor, hydrogen or ozone, the rate of oxidation of the silicon nitride film increases, and it becomes possible to form the silicon nitride film or silicon oxide film in a shorter time period. Further, as the rate of oxidation increases, the temperature for the manufacturing process can be made lower.

Further, heating may be performed in an activated oxygen atmosphere such as ozone. Further, in place of heating in an oxygen atmosphere, nitrogen atmosphere may be used. Alternatively, heating may be performed in an activated hydrogen atmosphere such as plasma. Heating may be performed in a halogen gas atmosphere such as chlorine or fluorine.

Further, in place of heating in the prescribed atmosphere described above, at least one element selected from the group consisting of oxygen, hydrogen and halogen may be introduced to the surface of the silicon nitride film by ion implantation.

By performing such a process, selectivity between the sidewall insulating film 10 and the source and drain regions 11a and 11b is ensured, and hence it becomes possible to prevent deposition of silicon pieces on sidewall insulating film 10 while the selective silicon film of a prescribed film thickness is formed.

Second Embodiment

Figure 15:
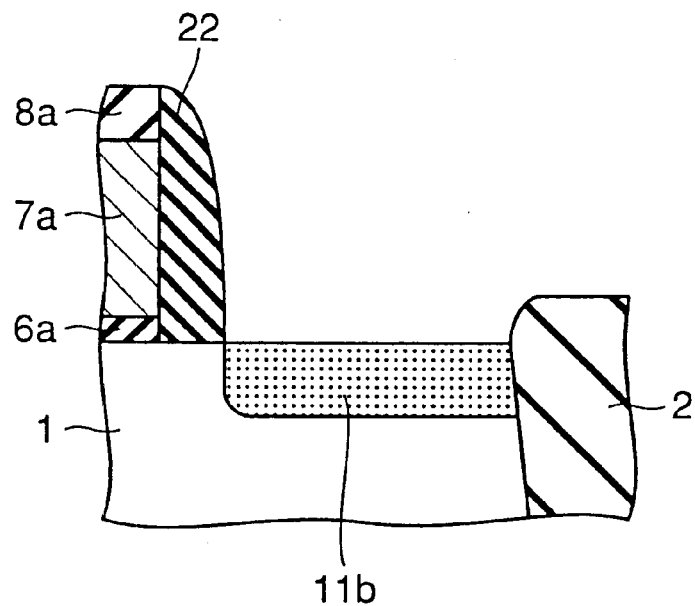
FIG. 15 is a cross sectional view showing a step of the method of manufacturing a semiconductor device in accordance with a second embodiment of the present invention.

A semiconductor device in accordance with the second embodiment of the present invention and manufacturing method thereof will be described. First, the manufacturing method will be described with reference to the figures. After the step of FIG. 4 described with reference to the first embodiment, the silicon nitride film is anisotropically etched, whereby a silicon nitride film 22 is formed on a side surface of polysilicon gate 7a as shown in FIG. 15. Thereafter, an impurity of a prescribed conductivity type is introduced by ion implantation to the surface of silicon substrate 1, so as to form source and drain region 11b and the like.

Figure 16:
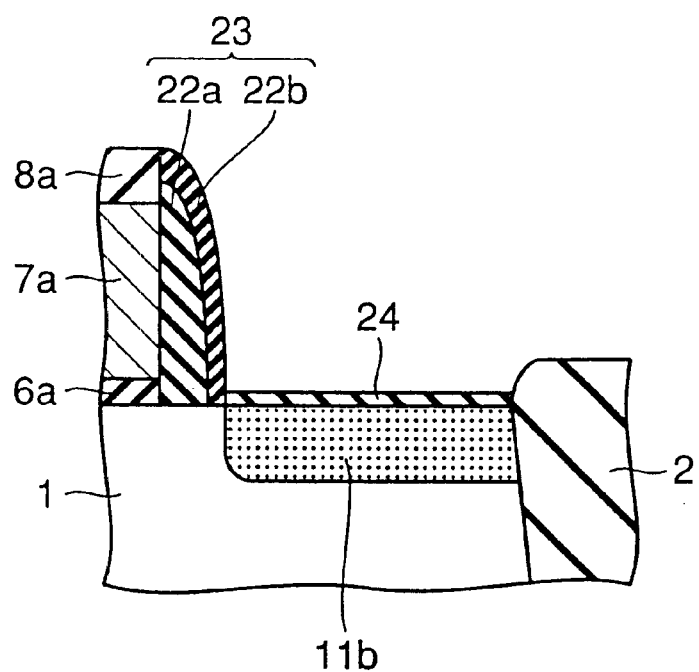
FIG. 16 is a cross sectional view showing the step following the step of FIG. 15 in the same embodiment.

Thereafter, referring to FIG. 16, silicon nitride film 22 is heat-treated in an oxygen atmosphere, whereby a silicon oxinitride film 22b is formed on the surface of silicon nitride film 22. At this time, a very thin silicon oxide film 24 is formed on source and drain region 11b and the like, while the inner portion of the silicon nitride film remains unoxidized, as silicon nitride film 22a. Thus, a sidewall insulating film 23 including silicon nitride film 22a and silicon oxinitride film 22b is formed.

Figure 17:
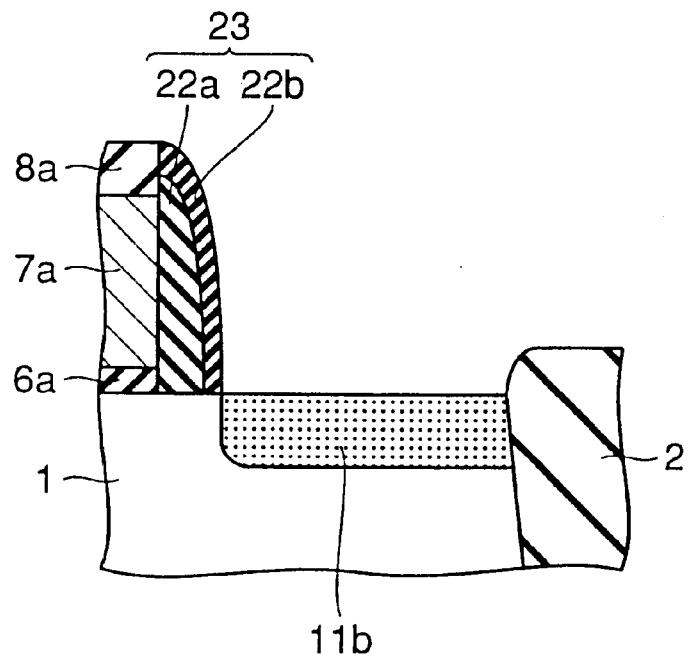
FIG. 17 is a cross sectional view showing the step following the step of FIG. 16 in the same embodiment.

Thereafter, as shown in FIG. 17, by continuing heat treatment with introduction of oxygen gas stopped, the very thin silicon oxide film 24 is evaporated. The step will be described in greater detail. The portion where the source and drain region 11b is formed is at the silicon substrate 1, that is, at a silicon single crystal portion.

Therefore, when heat treatment is performed in an oxygen atmosphere, the oxygen gas penetrates only to a region near the surface of source and drain region 11b, and not to a deeper region. As a result, the very thin silicon film 24 has relatively small thickness.

By contrast, the silicon nitride film is polycrystalline or amorphous with much defects. Therefore, oxygen gas penetrates to a deeper region, resulting in a relatively thick silicon oxinitride film 22b. Therefore, when heat treatment is performed with the introduction of oxygen gas stopped, the relatively thin silicon oxide film 24 evaporates at an early stage.

Figure 18:
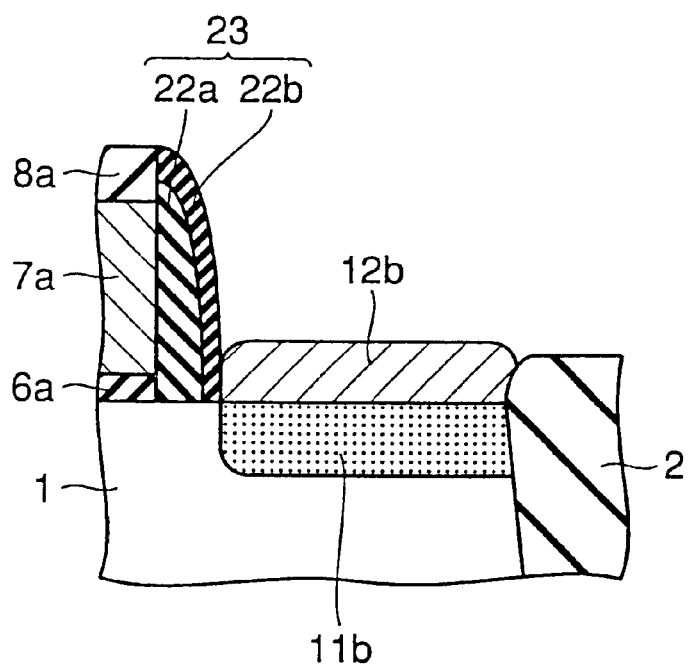
FIG. 18 is a cross sectional view showing the step following the step of FIG. 17 in the same embodiment.

Thereafter, as shown in FIG. 18, by the similar step as shown in FIG. 8 described with reference to the first embodiment, selective silicon film 12b is formed on source and drain region 11b. At this time, as the silicon oxinitride film 22b is formed on the surface of sidewall insulating film 23 as described in the first embodiment, the selective silicon film 12b requiring a relatively thick critical film thickness can be formed.

Thereafter, by the similar step as the step of FIG. 9 described with reference to the first embodiment, a semiconductor device having an MOS transistor is completed.

In the semiconductor device obtained through the above described manufacturing method, it is possible to prevent deposition of silicon pieces on the surface of the sidewall insulating film 23 while the selective silicon film 12b of a prescribed film thickness of at least 50 nm, as in the semiconductor device described with reference to the first embodiment.

As a result, it is possible to prevent electrical short-circuit of the source and drain region 11b with the other source and drain region or a source and drain region of another transistor, and therefore, transistor operation can be made stable.

Though heat treatment is performed in an oxygen atmosphere in the above described embodiment, water vapor, hydrogen or ozone may be added to the oxygen atmosphere. Further, in place of the oxygen atmosphere, an activated oxygen atmosphere such as ozone may be used for heat treatment.

By such a processing, selectivity between the sidewall insulating film 23 and the source and drain regions 11a and 11b is ensured, and therefore it becomes possible to prevent deposition of silicon pieces on sidewall insulating film 10 while the selective silicon film of a prescribed film thickness is formed.

Third Embodiment

Figure 19:
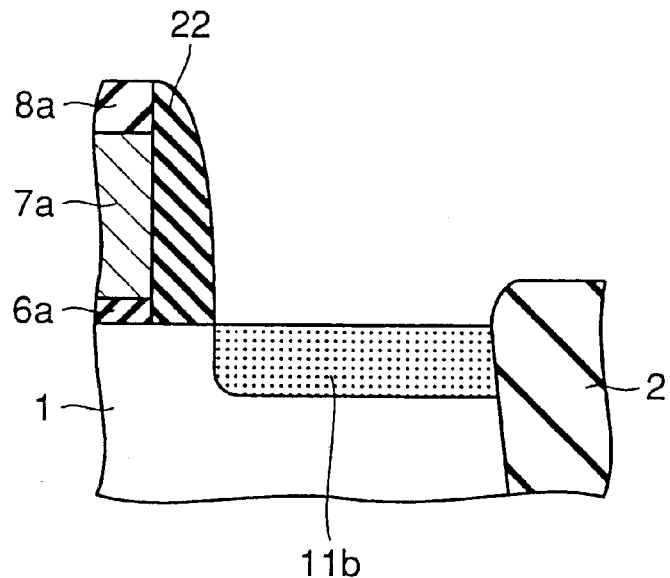
FIG. 19 is a cross sectional view showing a step of a method of manufacturing a semiconductor device in accordance with a third embodiment of the present invention.

The semiconductor device in accordance with the third embodiment of the present invention and manufacturing method thereof will be described. First, the manufacturing method will be described with reference to the figures. First, after the step shown in FIG. 4 described with reference to the first embodiment, the silicon nitride film is anisotropically etched, so as to form a silicon nitride film 22 on a side surface of polysilicon gate 7a as shown in FIG. 19.

Figure 20:
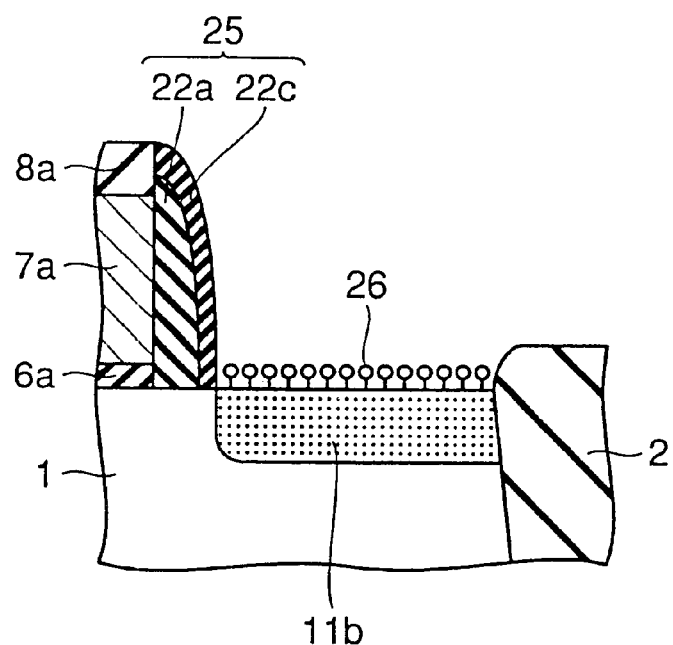
FIG. 20 is a cross sectional view showing the step following the step of FIG. 19 in the same embodiment.

Thereafter, as shown in FIG. 20, heat treatment is performed in a hydrogen atmosphere. Thus, hydrogen permeates to the surface and the vicinity of silicon nitride film 22, and a hydrogen containing layer 22c containing much hydrogen is formed. As the hydrogen does not enter to the inner portion of silicon nitride film 22, the inner portion remains as silicon nitride film 22a. Thus, a sidewall insulating film 25 including a silicon nitride film 22a and hydrogen containing layer 22c is formed. At this time, hydrogen 26 is attracted by and adheres to the source and drain region 11b.

Figure 21:
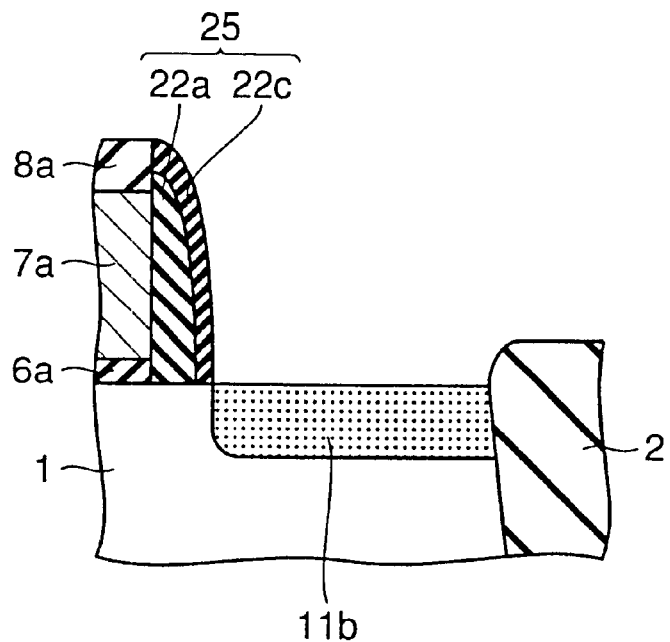
FIG. 21 is a cross sectional view showing the step following the step of FIG. 20 in the same embodiment.

Thereafter, as shown in FIG. 21, introduction of the hydrogen gas is stopped and heat treatment is further performed. At this time, hydrogen 26 adhered on source and drain region 11b evaporates. By contrast, as the large amount of hydrogen have been introduced to the silicon nitride film, hydrogen containing layer 22c is not evaporated but is left as it is.

Figure 2:
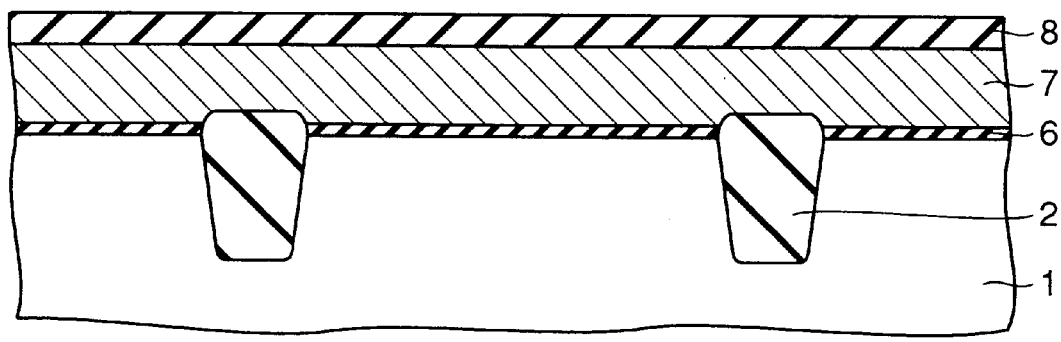
FIG. 2 is a cross section showing the step following the step of FIG. 1 of the same embodiment.
Figure 22:
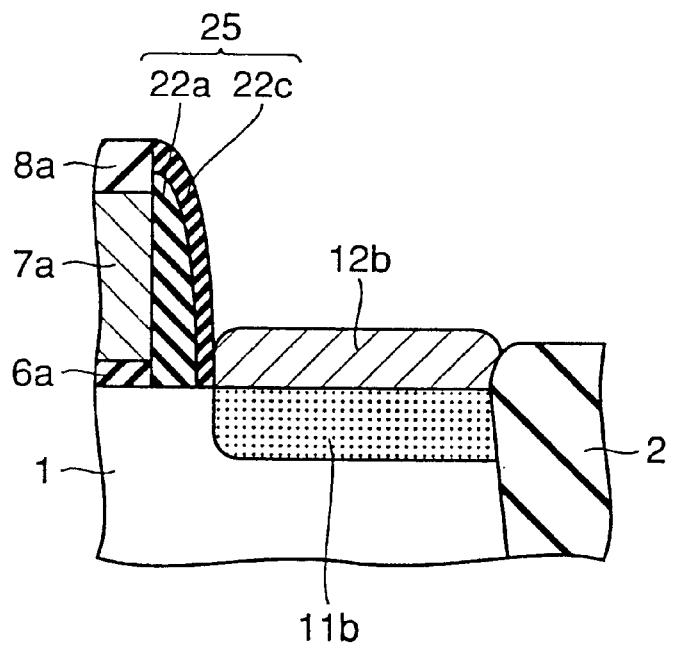
FIG. 22 is a cross sectional view showing the step following the step of FIG. 21 in the same embodiment.
Figure 23:
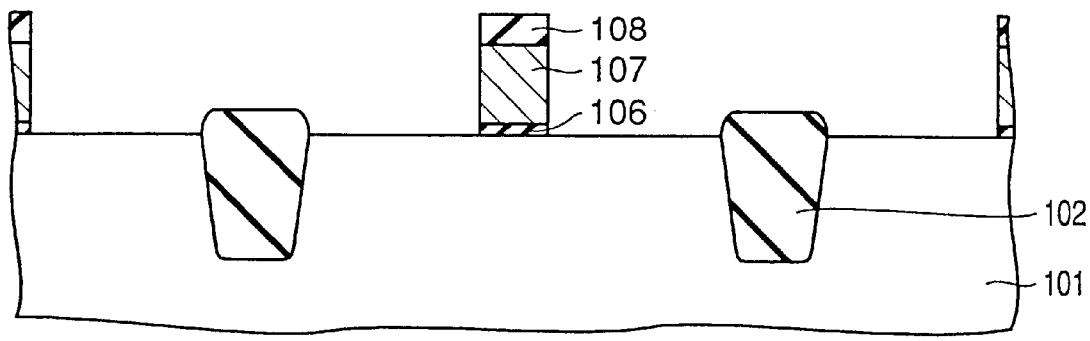
FIG. 23 is a cross sectional view showing a step of the conventional method of manufacturing a semiconductor device.
Figure 24:
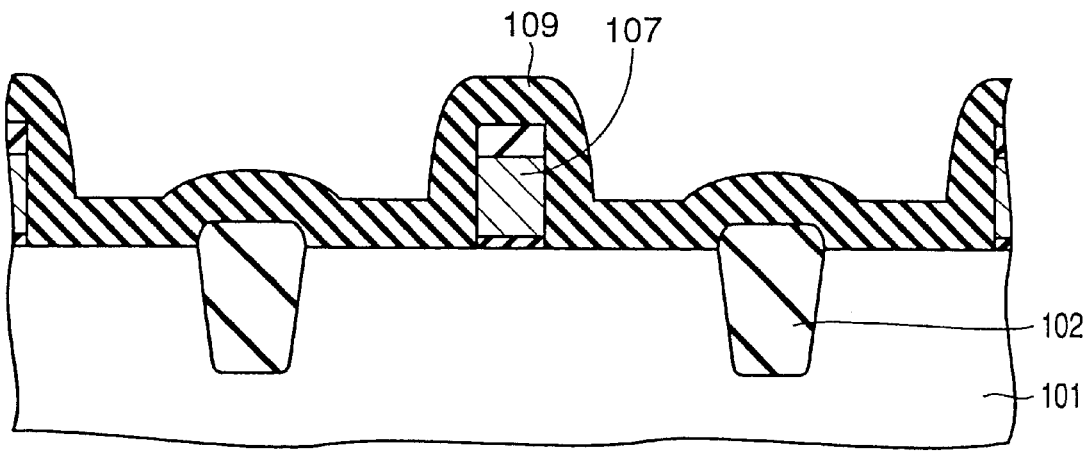
FIG. 24 is a cross sectional view showing the step following the step of FIG. 23.
Figure 25:
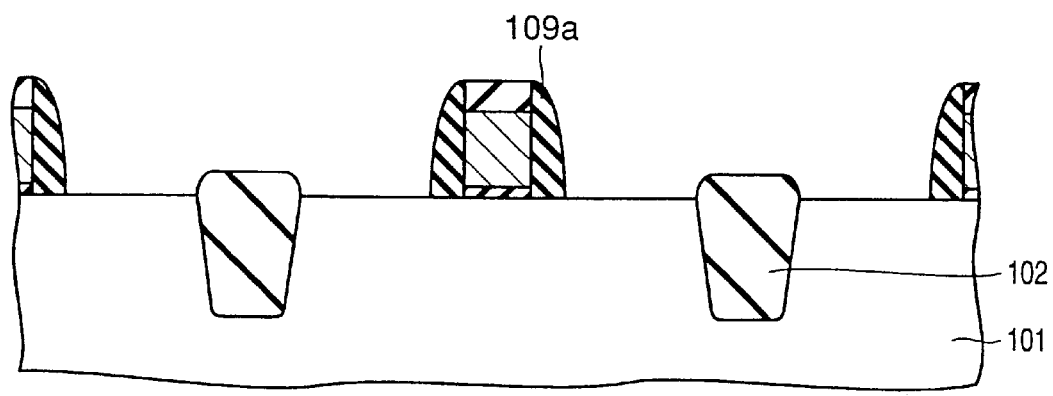
FIG. 25 is a cross sectional view showing the step following the step of FIG. 24.
Figure 26:
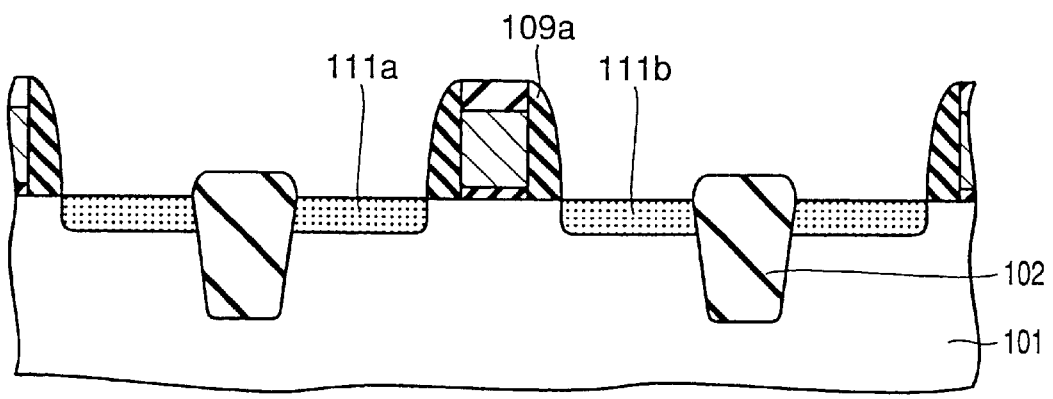
FIG. 26 is a cross sectional view showing the step following the step of FIG. 25.
Figure 27:
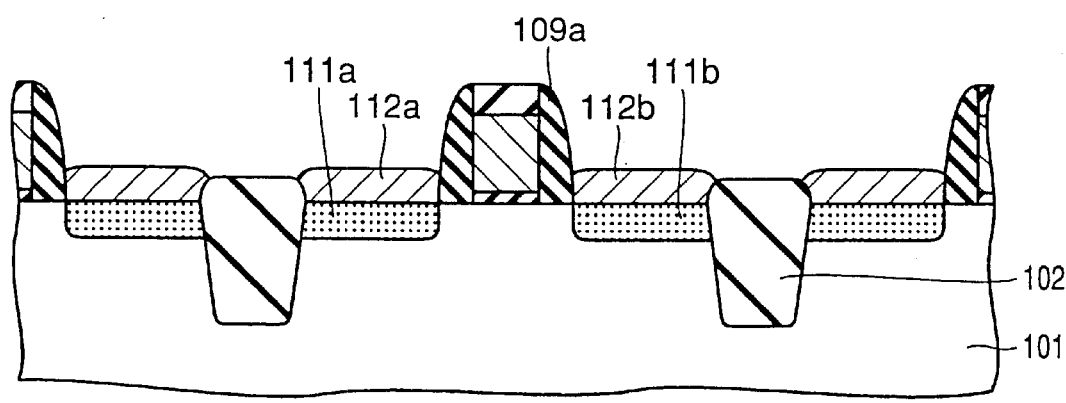
FIG. 27 is a cross sectional view showing the step following the step of FIG. 26.
Figure 28:
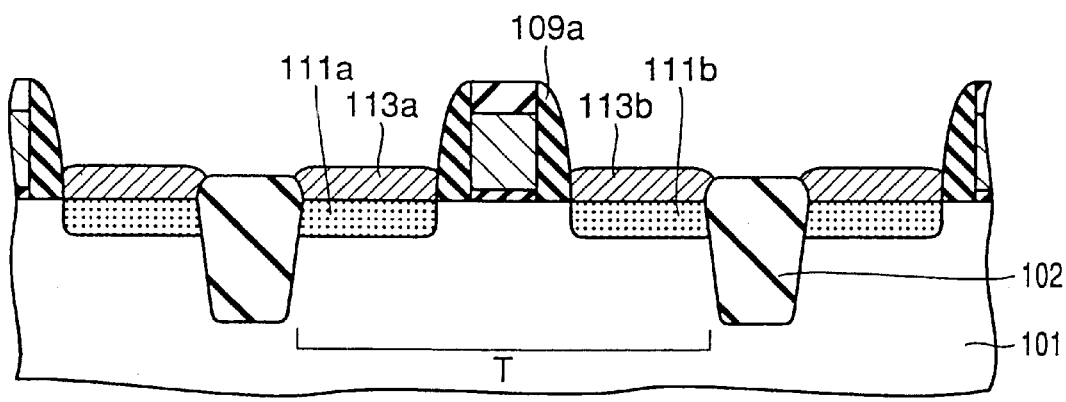
FIG. 28 is a cross sectional view showing the step following the step of FIG. 27.
Figure 29:
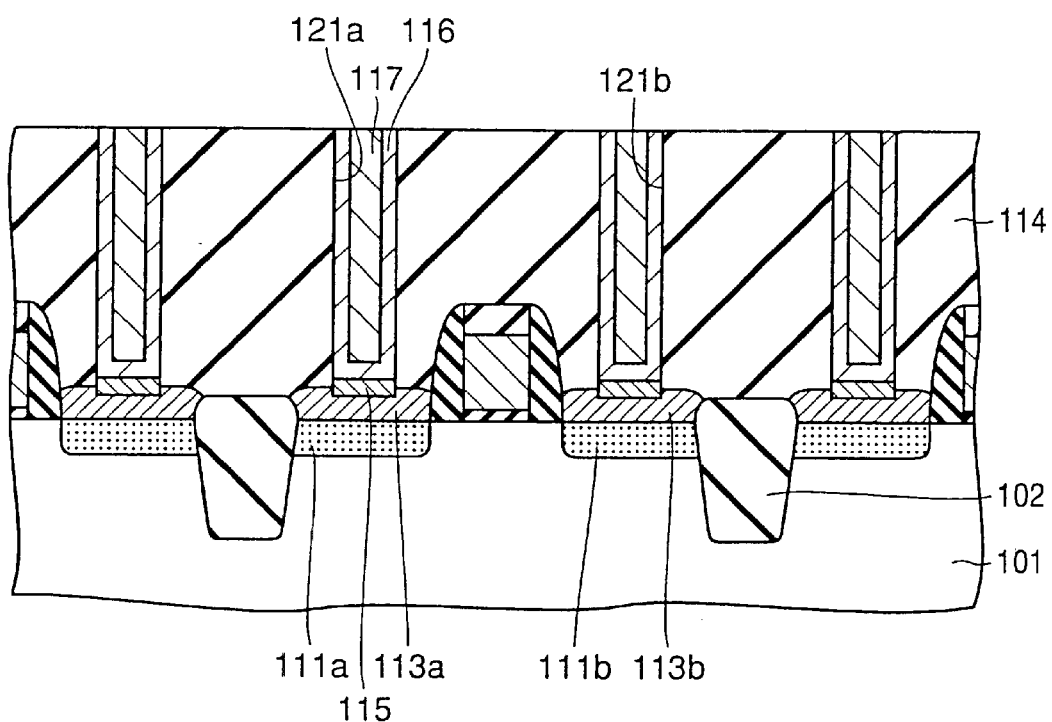
FIG. 29 is a cross sectional view showing the step following the step of FIG. 28.
Figure 30:
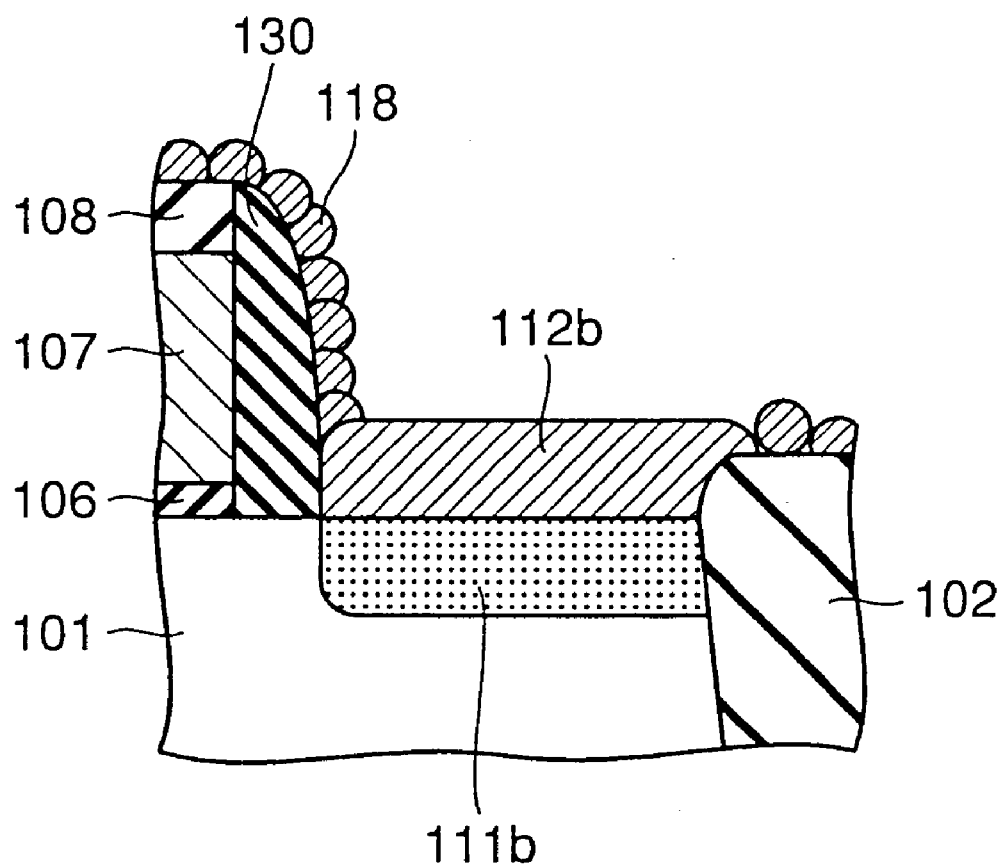
FIG. 30 is a cross sectional view illustrating the problem of the conventional semiconductor device.

Thereafter, as shown in FIG. 22, in the similar manner as in the step shown in FIG. 8 described with reference to FIG. 1, selective silicon film 12b or the like is formed on source and drain region 11b or the like. At this time, according to a technical article (M. Suemitsu, et al. "Si and Ge gas-source molecular beam epitaxy (GSMBE)", J. Crystal Growth 107 (1991) pp. 1015–1020), the higher the ratio of coverage of the surface by the hydrogen, the more the growth of selective silicon film is suppressed.

Here, a large amount of hydrogen is contained in the hydrogen containing layer 22c of sidewall insulating film 22. Therefore, even when hydrogen evaporates from the surface of hydrogen containing layer 22c, the hydrogen is supplied from the inside of hydrogen containing layer 22c, and therefore, the ratio of coverage by the hydrogen at the surface of hydrogen containing layer 22 is kept high.

As a result, generation of silicon pieces during epitaxial growth is suppressed at the surface of sidewall insulating film 25, while it is possible to form a relatively thick selective silicon film 12b on source and drain region 11b.

Thereafter, through the similar step as that shown in FIG. 9 described with reference to the first embodiment, a semiconductor device including an MOS transistor is completed.

In the semiconductor device, as in the semiconductor device described in the first embodiment, it is possible to prevent deposition of silicon pieces on the surface of sidewall insulating film 25, while the selective silicon film 12b of a prescribed thickness of at least 50 nm is formed.

As a result, electrical short-circuit of the source and drain region 11b with the other source and drain region or a source and drain region of another MOS transistor can be prevented, and the operation of the MOS transistor can be made stable.

Though heating in a hydrogen atmosphere has been described as an example in the embodiment above, similar effects can be attained when heating is performed in an activated hydrogen atmosphere such as hydrogen in the form of atoms.

Further, in the step of FIG. 20, similar effects can be attained by heat treatment in a halogen gas atmosphere, in place of heat treatment in hydrogen atmosphere. More specifically, when heat treatment is performed in a halogen gas atmosphere such as chlorine gas or fluorine gas, halogen gas is attracted by and adhered on the surface of source and drain region 11b and silicon nitride film 22.

When the structure is exposed to the material gas such as disilane with the halogen gas adhered, a volatile gas generates by the reaction between disilane and the halogen gas adhered on the silicon nitride film. Thus, it becomes possible to suppress generation of silicon pieces on the surface of silicon nitride film 22 while the selective silicon film 12b or the like of the prescribed film thickness is formed.

On the source and drain region 11b, a silicon growth layer is formed by the reaction between disilane and the silicon constituting the source and drain region. Therefore, the selective silicon film 12b is selectively formed on source and drain region 11b.

When heating is performed in a halogen gas atmosphere, unlike the oxygen atmosphere or hydrogen atmosphere, it is unnecessary to perform heat treatment after the introduction of halogen gas is stopped. By continuously introducing material gas such as disilane when introduction of the halogen gas is stopped, it is possible to form the desired selective silicon film 12b.

Alternatively, the selective silicon film 12b may be formed by stopping introduction of the halogen gas after the material gas such as disilane gas is introduced.

Though prescribed processing of a silicon nitride film used as a sidewall insulating film of a transistor has been described as an example in the embodiments above, the above described method may be widely applicable to electrical insulation between neighboring selective silicon films having prescribed film thicknesses.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a silicon substrate having a main surface;
   an electrode at the main surface of said silicon substrate;
   first and second doped regions having a first conductivity type, spaced apart from each other, in said silicon substrate at the main surface and sandwiching said electrode;
   first and second epitaxial silicon layers, spaced from each other, and disposed on the main surface of said silicon substrate on said first and second doped regions, respectively;
   a silicon nitride film at the main surface of said silicon substrate, covering said electrode, and sandwiched between said first and second epitaxial silicon layers and said first and second doped regions; and
   a protective layer on said silicon nitride film, preventing deposition of silicon on said silicon nitride film during epitaxial growth of said first and second epitaxial silicon layers.

2. The semiconductor device according to claim 1, wherein said silicon nitride film and said protective layer together form a sidewall insulating film on a side surface of said electrode.

3. The semiconductor device according to claim 1, wherein said protective layer includes at least one element selected from the group consisting of oxygen, hydrogen, and a halogen.

4. The semiconductor device according to claim 1, wherein said first and second epitaxial silicon layers are at least 50 nm thick.

5. The semiconductor device according to claim 1, wherein said protective layer is silicon oxynitride.

6. A method of manufacturing a semiconductor device comprising:
   forming an electrode supported by and separated from a main surface of a silicon substrate by an insulating film;
   forming a silicon nitride film on the main surface of said silicon substrate and covering said electrode;
   processing said silicon nitride film to form a protective layer on the surface of said silicon nitride film, said protective layer preventing epitaxial growth of silicon on said protective layer when silicon is epitaxially grown on the main surface of the silicon substrate, provided the epitaxial silicon is not grown to a thickness exceeding a critical film thickness;
   forming a sidewall insulating film protecting said electrode by removing said protective layer and said silicon nitride film from the main surface of said silicon substrate while leaving parts of said silicon nitride film and parts of said protective layer covering said parts of said silicon nitride film;
   forming first and second doped regions, in said silicon substrate at the main surface, spaced apart from each other, and on opposite sides of said electrode; and
   epitaxially growing first and second silicon films on said first and second doped regions, respectively, to a thickness no larger than the critical film thickness.

7. The method of manufacturing a semiconductor device according to claim 6, wherein removing said protective layer and said silicon nitride film from the main surface of said silicon substrate includes anisotropically etching said silicon nitride film and said protective layer.

8. The method of manufacturing a semiconductor device according to claim 6, including processing of said silicon nitride film by heat treating in an oxygen ambient.

9. The method of manufacturing a semiconductor device according to claim 8, including adding water vapor to the oxygen ambient.

10. The method of manufacturing a semiconductor device according to claim 8, including adding hydrogen to the oxygen ambient.

11. The method of manufacturing a semiconductor device according to claim 8, including adding ozone to the oxygen ambient.

12. The method of manufacturing a semiconductor device according to claim 6, including processing said silicon nitride film by heat treating in a hydrogen ambient.

13. The method of manufacturing a semiconductor device according to claim 6, processing of said silicon nitride film by heat treating in a halogen ambient.

14. The method of manufacturing a semiconductor device according to claim 6, including processing of said silicon nitride film by heat treating in an ozone ambient.

15. The method of manufacturing a semiconductor device according to claim 6, including processing of said silicon nitride film by ion implantation of at least one element selected from the group consisting of oxygen, hydrogen, and a halogen.

16. A method of manufacturing a semiconductor device comprising:

forming an electrode supported by and separated from a main surface of a silicon substrate by an insulating film;

forming a silicon nitride film on the main surface of said silicon substrate and covering said electrode;

removing said silicon nitride film from the main surface of said silicon substrate while leaving parts of said silicon nitride film covering said electrode;

processing said silicon nitride film covering said electrode to form a protective layer on the surface of said silicon nitride film, said protective layer preventing epitaxial growth of silicon on said protective layer when silicon is epitaxially grown on the main surface of the silicon substrate, provided the epitaxial silicon is not grown to a thickness exceeding a critical film thickness; and forming first and second doped regions in said silicon substrate at the main surface, spaced apart from each other, and on opposite sides of said electrode; and epitaxially growing firsthand second silicon films on said first and second doped regions, respectively, to a thickness no larger than the critical film thickness.

17. The method of manufacturing a semiconductor device according to claim 16, including processing of said silicon nitride film by heat treating in an oxygen ambient.

18. The method of manufacturing a semiconductor device according to claim 17, including adding water vapor to the oxygen ambient.

19. The method of manufacturing a semiconductor device according to claim 16, including processing said silicon nitride film by heat treating in a hydrogen ambient.

20. The method of manufacturing a semiconductor device according to claim 16, including processing of said silicon nitride film by heat treating in a halogen ambient.

21. The method of manufacturing a semiconductor device according to claim 16, including processing of said silicon nitride film by heat treating in an ozone ambient.

22. The method of manufacturing a semiconductor device according to claim 16, including processing of said silicon nitride film by ion implantation of at least one element selected from the group consisting of oxygen, hydrogen, and a halogen.

* * * * *